(12) United States Patent
Koyanagi

(10) Patent No.: US 10,892,200 B2
(45) Date of Patent: Jan. 12, 2021

(54) SEMICONDUCTOR APPARATUS AND ELECTRIC POWER CONVERSION APPARATUS

(71) Applicant: Mitsubishi Electric Corporation, Tokyo (JP)

(72) Inventor: Makoto Koyanagi, Hyogo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/027,450

(22) Filed: Jul. 5, 2018

(65) Prior Publication Data

US 2019/0164858 A1    May 30, 2019

(30) Foreign Application Priority Data

Nov. 27, 2017   (JP) ................................ 2017-226438

(51) Int. Cl.
*H01L 23/049*    (2006.01)
*H02M 7/537*    (2006.01)
(Continued)

(52) U.S. Cl.
CPC ............ *H01L 23/10* (2013.01); *H01L 23/049* (2013.01); *H01L 23/053* (2013.01); *H01L 25/18* (2013.01); *H02M 7/003* (2013.01); *H02M 7/537* (2013.01); *H01L 24/48* (2013.01); *H01L 24/49* (2013.01); *H01L 2224/48137* (2013.01); *H01L 2224/48139* (2013.01); *H01L 2224/48227* (2013.01);
(Continued)

(58) Field of Classification Search
CPC ......... H01L 23/02; H01L 23/12; H01L 23/13; H01L 23/04; H01L 23/3675; H01L 23/049; H02M 7/0003; H02M 7/537
See application file for complete search history.

(56) References Cited

U.S. PATENT DOCUMENTS 5,455,386 A * 10/1995 Brathwaite ............. H01L 23/10
174/522
2008/0174983 A1    7/2008 Kitamura et al.
(Continued)

FOREIGN PATENT DOCUMENTS

JP           04212498 A  *  8/1992
JP        H11-307658 A    11/1999
(Continued)

OTHER PUBLICATIONS

An Office Action; "Notice of Reasons for Refusal," mailed by the Japanese Patent Office dated Sep. 8, 2020, which corresponds to Japanese Patent Application No. 2017-226438 and is related to U.S. Appl. No. 16/027,450; with English language translation.
(Continued)

*Primary Examiner* — Thanhha S Pham
(74) *Attorney, Agent, or Firm* — Studebaker & Brackett PC

(57) ABSTRACT

A semiconductor apparatus includes a base plate, an adhesive agent provided on an upper face of the base plate, and a casing having a lower face and an inclined face continuous to the lower face and positioned closer to a center of the base plate than the lower face, and fixed to the base plate through the adhesive agent adhering to the lower face and the inclined face, wherein of the adhesive agent, a portion that is in contact with the inclined face is thicker than a portion thereof that is in contact with the lower face.

16 Claims, 3 Drawing Sheets

(51) Int. Cl.
  *H01L 23/00* (2006.01)
  *H01L 23/10* (2006.01)
  *H01L 25/18* (2006.01)
  *H02M 7/00* (2006.01)
  *H01L 23/053* (2006.01)
  *H02P 27/08* (2006.01)
  *H02P 27/06* (2006.01)

(52) U.S. Cl.
  CPC ............ *H01L 2224/49109* (2013.01); *H01L 2924/1203* (2013.01); *H01L 2924/13055* (2013.01); *H01L 2924/14252* (2013.01); *H02P 27/06* (2013.01); *H02P 27/08* (2013.01)

(56) References Cited

U.S. PATENT DOCUMENTS

2016/0020707 A1* 1/2016 Fukumasu ............ H02M 7/003
                                                              363/131
2017/0003337 A1* 1/2017 Bito .................... H01L 29/7395
2019/0057873 A1    2/2019 Sugahara et al.

FOREIGN PATENT DOCUMENTS

| JP | 2000-323593 A | 11/2000 |
| JP | 2009-010170 A | 1/2009 |
| JP | 2014-158003 A | 8/2014 |
| WO | 2017/169086 A1 | 10/2017 |

OTHER PUBLICATIONS

An Office Action mailed by the German Patent Office dated Sep. 10, 2020, which corresponds to German Patent Application No. 102018214055.3 and is related to U.S. Appl. No. 16/027,450; with English language translation.

* cited by examiner

SEMICONDUCTOR APPARATUS AND ELECTRIC POWER CONVERSION APPARATUS

BACKGROUND

Field

The present invention relates to a semiconductor apparatus and an electric power conversion apparatus.

Background Art

Japanese Unexamined Patent Application Publication No. 11-307658 discloses a semiconductor apparatus package having a heat radiation metal base plate and a surrounding resin casing joined together with an adhesive agent, in which package a circuit assembly is mounted on the base plate and the easing is overlapped on the surrounding edge of the base plate. A stepped groove is formed along the inner surrounding edge at the bottom of the surrounding resin casing, and the adhesive agent is applied into the groove. For such a semiconductor apparatus package, Japanese Unexamined Patent Application Publication No. 11-307658 discloses to form a reservoir space for the adhesive agent in the aforementioned stepped groove.

When the base plate and the casing are bonded with an adhesive agent, bubbles in the adhesive agent can expand into get bubbles through which creeping discharge arises immediately below the casing, which situation problematically causes insulation failure. For example, such bubbles sometimes appear on the surface of the adhesive agent during an insulation test of a semiconductor apparatus at high temperature. The creeping discharge particularly tends to arise in a structure having a close insulation distance.

SUMMARY

The present invention is devised in order to solve the problem as above, and an object thereof is to provide a semiconductor apparatus and an electric power conversion apparatus capable of improving insulation characteristics.

In some examples, a semiconductor apparatus includes a base plate, an adhesive agent provided on an upper face of the base plate, and a casing having a lower face and an inclined face continuous to the lower face and positioned closer to a center of the base plate than the lower face, and fixed to the base plate through the adhesive agent adhering to the lower face and the inclined face, wherein of the adhesive agent, a portion that is in contact with the inclined face is thicker than a portion thereof that is in contact with the lower face.

Other and further objects, features and advantages of the invention will appear more fully from the following description.

DETAILED DESCRIPTION

Semiconductor apparatuses and electric power conversion apparatuses according to embodiments will be described with reference to drawings. The same or corresponding constituents are given the same signs, and their duplicate description is sometimes omitted.

First Embodiment

Figure 1:
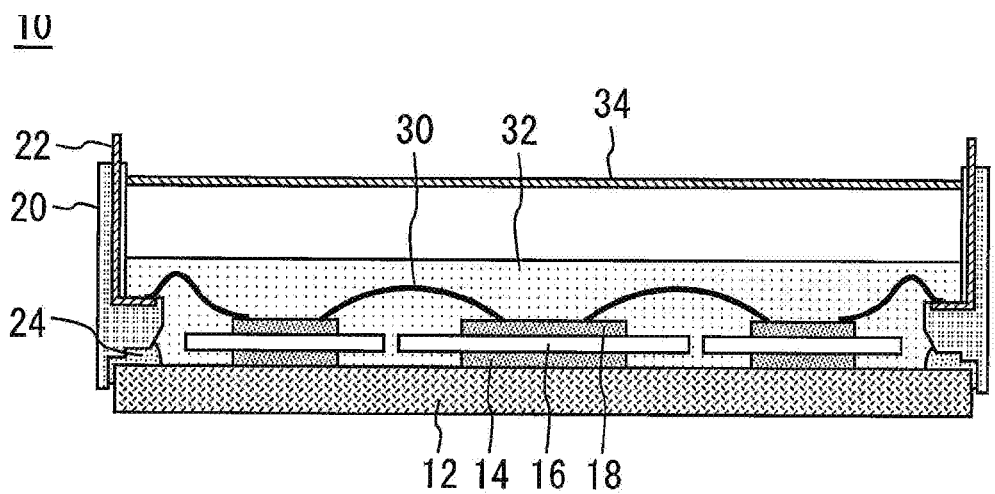
FIG. 1 is a cross-sectional view of a semiconductor apparatus according to a first embodiment.

FIG. 1 is a cross-sectional view of a semiconductor apparatus 10 according to a first embodiment. The semiconductor apparatus 10 includes a base plate 12. Insulative circuit boards 16 are fixed to the base plate 12 with solder 14. The insulative circuit board 16 includes an insulative material such, for example, as AlN (aluminum nitride) excellent in heat radiation ability, and a circuit pattern formed on the insulative material. Semiconductor devices 18 are fixed to upper faces of the insulative circuit boards 16. The semiconductor devices 18 can be configured, for example, of an IGBT (Insulated-Gate Bipolar Transistor) chip and a diode chip.

The insulative circuit boards 16 and the semiconductor devices 18 are enclosed by a casing 20. Electrodes 22 are embedded in the casing 20. The electrodes 22 are partially exposed inside the casing 20. Moreover, the electrodes 22 are partially positioned in an upper part above the casing 20, and thereby, the electrodes 22 can be externally connected. The electrodes 22 can be formed, for example, of Cu plated with Ni in order to improve soldering ability.

The casing 20 is fixed an upper face of the base plate 12 with an adhesive agent 24. Examples of the adhesive agent 24 used can include a cold setting adhesive agent, a thermosetting adhesive agent which hardens through promotion of its polymerization by heating, an energy ray-curable adhesive agent which hardens through promotion of its polymerization by irradiation with ultraviolet rays or the like, and the like. For example, a conductive adhesive agent containing conductive particles can be used.

The semiconductor devices 18 and the electrodes 22 are connected with wires 30. The inside of the casing 20 is filled with a sealing material 32 such as silicone gel. A lid 34 is provided above the sealing material 32. The material of the lid 34 and the casing 20 is engineering plastics such, for example, as PPS resin. As above, the semiconductor apparatus 10 is a power module of a type in which the base plate 12 and the casing 20 are joined with the adhesive agent 24.

Figure 2:
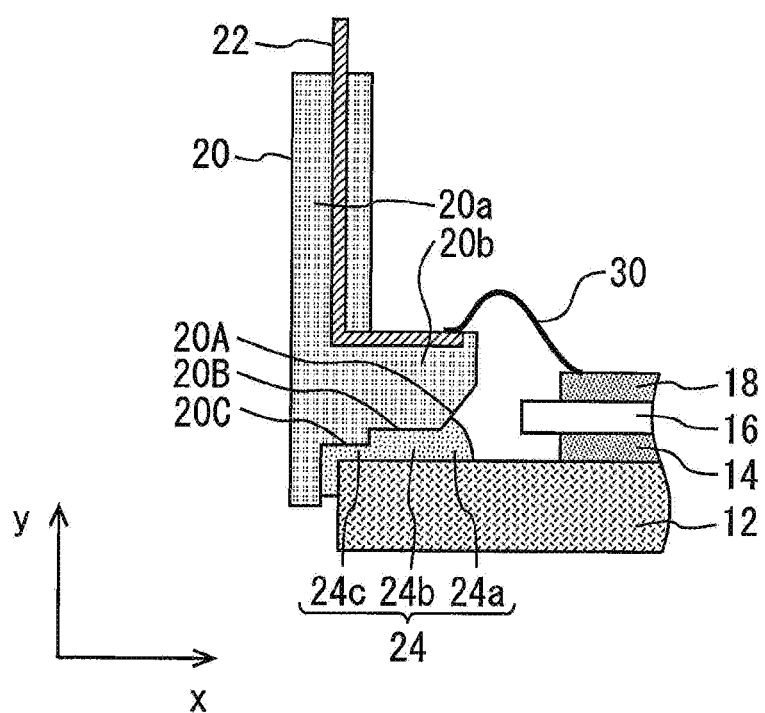
FIG. 2 is an expanded view of a bonding portion.

FIG. 2 is an expanded view of a bonding portion between the casing 20 and the base plate 12 in FIG. 1. The casing 20 includes a first portion 20a extending longitudinally in the y-direction, and a second portion 20b protruding from the first portion 20a in the direction toward the center of the base plate 12. The electrode 22 is exposed from an upper face of the second portion 20b. The second portion 20b has an inclined face 20A, a first lower face 20B continuous to the inclined face 20A, and a second lower face 20C continuous to the first lower face 20B. The inclined face 20A is provided by making a taper in the second portion 20b. The second lower face 20C is positioned in a lower part below the first lower face 20B. Namely, the first lower face 20B corresponds to a counterbored part. The inclined face 20A is positioned closer to the center of the base plate 12 than the first lower face 20B and the second lower face 20C, The second lower face 20C is positioned farther from the center of the base plate 12 than the first lower face 20B.

The adhesive agent 24 provided on the upper face of the base plate 12 is in contact with the inclined face 20A, the first lower face 20B and the second lower face 20C. The adhesive agent 24 includes an outer part 24c in contact with the second lower face 20C, a center part 24b in contact with the first lower face 20B, and an adhesive fillet 24a in contact with the inclined face 20A. The adhesive fillet 24a is a portion of partial protrusion of the adhesive agent which has flowed between the casing 20 and the base plate 12 in the direction toward the center of the base plate 12. The adhesive fillet 24a in contact with the inclined face 20A is thicker than the outer part 24c and the center part 24b. Since the adhesive fillet 24a is a portion pushed out in the process of production, it is convex in the direction toward the center of the base plate 12. The casing 20 is fixed to the base plate 12 by the adhesive agent 24 provided on the inclined face 20A, the first lower face 20B and the second lower face 20C and on the upper face of the base plate 12.

The adhesive agent 24 is heated in the production process of the semiconductor apparatus. If the adhesive fillet is thin, bubbles tend to appear on the surface of the adhesive fillet in heating. Therefore, in the first embodiment, the volume of the adhesive fillet 24a is increased. Specifically, since the first lower face 20B is located in an upper part above the second lower face 20C, the amount of application of the adhesive agent 24 can be increased by making the center part 24b thicker than the outer part 24c. The adhesive fillet 24a is continuous to this thick center part 24b and in contact with the inclined face 20A. Therefore, the adhesive fillet 24a can be made thick. Forming such a thick adhesive fillet 24a can reduce bubbles appearing on the surface after heating. Reducing bubbles can improve insulation characteristics of the semiconductor apparatus 10.

In the semiconductor apparatus 10 according to the first embodiment, the adhesive fillet 24a is made thick in accordance with the shape of the casing 20. Various shapes of the casing 20 can be considered for making the adhesive fillet 24a thick with such shapes. For example, while the first lower face 20B and the second lower face 20C are provided in the casing 20, three or more lower faces may be provided therein. In this case, the adhesive fillet 24a can be made thick by making the plurality of lower faces higher in level as going in the direction toward the center of the base plate 12.

Since the adhesive fillet 24a is an extra portion pushed out from between the casing 20 and the base plate 12 in the process of production, it is normally convex in the direction toward the center of the base plate 12. In other words, the surface of the adhesive fillet 24a is a curved surface that rises at its center. Such a convex adhesive fillet 24a can be more easily made thick than an adhesive fillet having a concave or flat surface.

The aforementioned modification can be applied to semiconductor apparatuses according to embodiments below. Notably, differences between the semiconductor apparatuses according to the embodiments below and that according to the first embodiment will be mainly described since they have many in common with those in the first embodiment.

Second Embodiment

Figure 3:
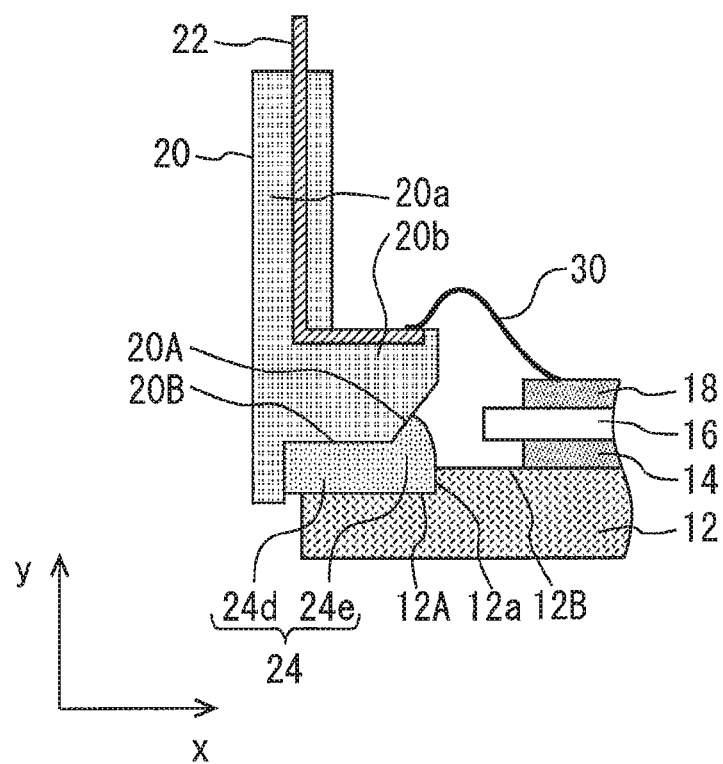
FIG. 3 is a partially expanded view of a semiconductor apparatus according to a second embodiment.

FIG. 3 is a partially expanded view of a semiconductor apparatus according to a second embodiment. The upper face of the base plate 12 has a first upper face 12A and a second upper face 12B positioned in an upper part above the first upper face 12A. A sidewall 12a is formed by a level difference between the first upper face 12A and the second upper face 12B. In plan view, the second upper face 12B is enclosed by the first upper face 12A. The adhesive agent 24 is applied to the first upper face 12A. The semiconductor device 18 is provided immediately above the second upper face 12B. In the second portion 20b of the casing 20, the inclined face 20A and a lower face 20B continuous to the inclined face 20A are provided.

The adhesive agent 24 includes a main body part 24d and an adhesive fillet 24e. The main body part 24d is in contact with the first upper face 12A and the lower face 20B. The adhesive fillet 24e is in contact with the first upper face 12A, the sidewall 12a and the inclined face 20A. Since the first upper face 12A is positioned in a lower part below the second upper face 12B, the volume of main body part 24d can be increased which is provided on the first upper face 12A.

The adhesive fillet 24e is formed thick by being in contact with the thick main body part 24d and the sidewall 12a. Accordingly, the volume of the adhesive fillet 24e can be increased. Such a large volume of the adhesive fillet 24e can reduce the number of bubbles appearing on the surface of the adhesive fillet after heating.

Making the second upper face 12B higher in level than the first upper face 12A causes the flow of the adhesive agent 24 to be dammed up by the sidewall 12a. Therefore, the adhesive agent 24 can be prevented from sticking to the insulative circuit board 16, the semiconductor device 18 or the like.

Both of the first embodiment and the second embodiment are configured to make the adhesive fillet thick to increase the volume of the adhesive fillet. The adhesive fillet formed by being pushed out from the lower face of the casing comes into contact with the inclined face of the casing, so that the adhesive fillet can be made thick.

Third Embodiment

Figure 4:
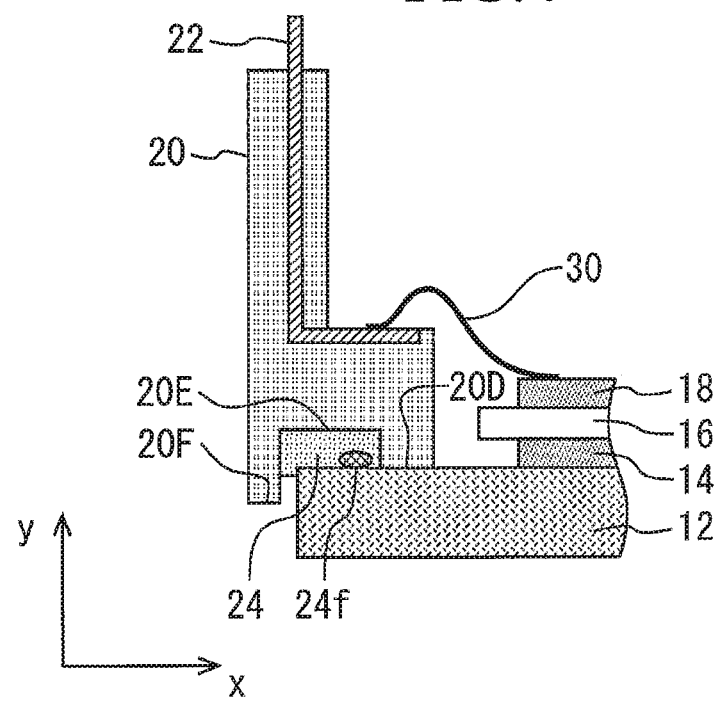
FIG. 4 is a partially expanded view of a semiconductor apparatus according to a third embodiment.

FIG. 4 is a partially expanded view of a semiconductor apparatus according to a third embodiment. The casing 20 has a contact lower face 20D, a non-contact lower face 20E and an outer edge lower face 20F. The contact lower face 20D and the outer edge lower face 20F extend more below the non-contact lower face 20E, and thereby, a recess is provided in the easing 20. The contact lower face 20D is in contact with the upper face of the base plate 12. The non-contact lower face 20E is positioned farther from the semiconductor device 18 than the contact lower face 20D and is positioned in an upper part above the contact lower face 20D. The outer edge lower face 20F is positioned farther from the semiconductor device 18 than the contact lower face 20D and the non-contact lower face 20E.

The adhesive agent 24 is in contact with the non-contact lower face 20E and the base plate 12. Therefore, the adhesive agent 24 is provided in the aforementioned recess of the casing 20. The adhesive agent 24 is separated from the inside the casing 20 due to the presence of the contact lower face 20D. Thus, insulation failure can be prevented even if bubbles appear on the surface of the adhesive agent 24 in heating. For example, even when a bubble 24f is generated, discharge caused by the bubble 24f does not arise.

Fourth Embodiment

In the present embodiment, any of the aforementioned semiconductor apparatuses according to the first embodiment to the third embodiment is applied to an electric power conversion apparatus. This electric power conversion apparatus is not limited to a specific electric power conversion apparatus, but hereafter, it is described as the fourth embodiment in which any of the aforementioned semiconductor apparatuses is applied to a three-phase inverter.

Figure 5:
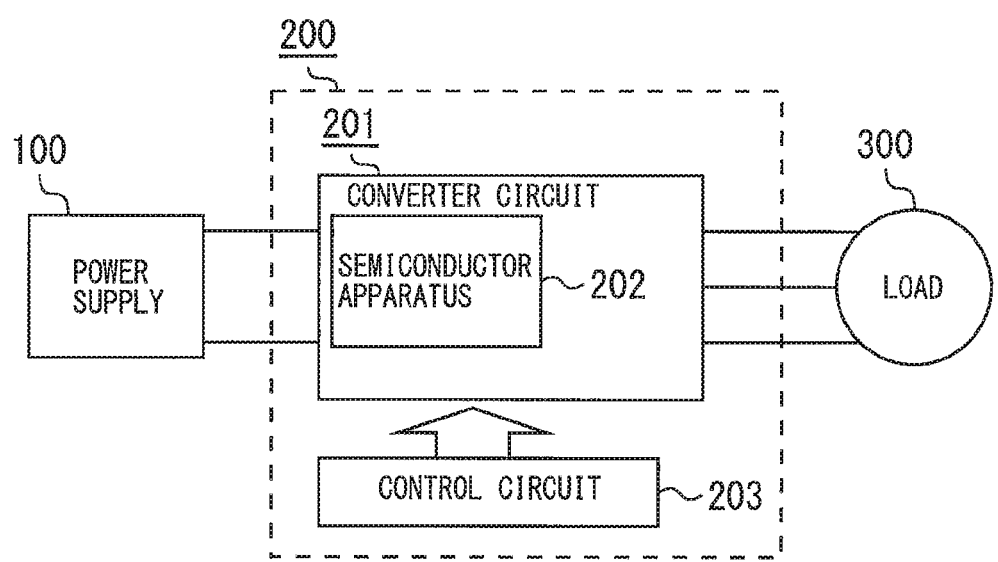
FIG. 5 is a block diagram illustrating a configuration of an electric power conversion system.

FIG. 5 is a block diagram illustrating a configuration of an electric power conversion system to which the electric power conversion apparatus according to the present embodiment is applied.

The electric power conversion system illustrated in FIG. 5 is configured of a power supply 100, an electric power conversion apparatus 200 and a load 300. The power supply 100 is a DC power supply and supplies DC electric power to the electric power conversion apparatus 200. The power supply 100 can be configured of various components. It can be configured, for example, of a DC system, a solar cell and a storage battery. It may be configured of a rectifier circuit or an AC/DC converter connected to an AC system. Moreover, the power supply 100 may be configured of a DC/DC converter which converts DC electric power output from a DC system into predetermined electric power.

The electric power conversion apparatus 200 is a three-phase inverter connected between the power supply 100 and the load 300. It converts DC electric power supplied from the power supply 100 into AC electric power and supplies the AC electric power to the load 300. As illustrated in FIG. 5, the electric power conversion apparatus 200 includes a primary converter circuit 201 which converts the DC electric power into the AC electric power and outputs it, and a control circuit 203 which outputs a control signal for controlling the primary converter circuit 201 to the primary converter circuit 201.

The load 300 is a three-phase motor which is driven by the AC electric power supplied from the electric power conversion apparatus 200. Notably, the load 300 is not limitedly used for a specific purpose but is a motor which can be implemented in various electric devices. For example, it can be used as a motor for a hybrid vehicle, an electric vehicle, a railway vehicle, an elevator or an air conditioner Hereafter, details of the electric power conversion apparatus 200 are described. The primary converter circuit 201 includes switching devices and freewheeling diodes (which are not shown). The DC electric power supplied from the power supply 100 is converted into the AC electric power by the switching devices switching, and is supplied to the load 300. Various specific circuit configurations of the primary converter circuit 201 are possible. The primary converter circuit 201 according to the present embodiment is a two-level three-phase full bridge circuit and can be configured of six switching devices and six freewheeling diodes which are individually connected to the switching devices in anti-parallel. The aforementioned semiconductor apparatus according to any of the first embodiment to third embodiment is applied to at least any of the switching devices and the freewheeling diodes of the primary converter circuit 201. The six switching devices are connected in series for every two switching devices and constitute pairs of upper and lower arms. Each of the pairs of upper and lower arms constitutes each phase (U-phase, V-phase, W-phase) of the full bridge circuit. Output terminals of the pairs of upper and lower arms, that is, three output terminals of the primary converter circuit 201 are connected to the load 300.

Moreover, the primary converter circuit 201 includes a drive circuit (not shown) which drives the switching devices. The drive circuit may be built in a semiconductor apparatus 202, or may be configured to include a separate drive circuit from the semiconductor apparatus 202. The drive circuit generates drive signals for driving the switching devices of the primary converter circuit 201 and supplies them to control electrodes of the switching devices of the primary converter circuit 201. Specifically, in accordance with the control signal from the control circuit 203 mentioned later, the drive circuit outputs a drive signal for turning ON the switching device and a drive signal for turning OFF the switching device to the control electrodes of the switching devices. When a switching device is maintained to be turned ON, the drive signal is a voltage signal (ON-signal) not less than the threshold voltage of the switching device. When a switching device is maintained to be turned OFF, the drive signal is a voltage signal (OFF-signal) not more than the threshold voltage of the switching device.

The control circuit 203 controls the switching devices of the primary converter circuit 201 such that desired electric power is supplied to the load 300. Specifically, it calculates a time during which each switching device of the primary converter circuit 201 is to be turned ON (ON-time) on the basis of the electric power to be supplied to the load 300. For example, primary converter circuit 201 can be controlled by PWM control which modulates the ON-time for the switching device in accordance with a voltage to be output. Then, the control circuit 203 outputs a control instruction (control signal) to the drive circuit included by the primary converter circuit 201 such that the ON-signal is output to the switching device to be turned ON and the OFF-signal is output to the switching device to be turn OFF at every time point. In accordance with this control signal, the drive circuit outputs the ON-signal or the OFF-signal as the drive signal to the control electrode of each switching device.

In the electric power conversion apparatus according to the present embodiment, any of the semiconductor apparatuses according to the first embodiment to the third embodiment is applied as the semiconductor apparatus, of the primary converter circuit 201, having the switching devices and the freewheeling diodes, which thereby can improve insulation characteristics.

The present examples has been exemplarily described as being applied to a two-level three-phase inverter. The present examples is not limited to this but can be applied to various electric power conversion apparatuses. The present embodiment is an application to a two-level electric power conversion apparatus, which however may be a three-level or multi-level electric power conversion apparatus instead. Otherwise, the present examples may be applied to a single phase inverter when electric power is supplied to a single phase load. Moreover, the present examples can also be applied to a DC/DC converter or an AC/DC converter when electric power is supplied to a direct current load.

Moreover, the electric power conversion apparatus to which the present example is applied is not limited to including a motor as the aforementioned load. For example, it can be used as an electric discharge machine, a laser beam machine, an induction heating cooker, or power supply equipment of a contactless power feed system. Furthermore, it can also be used as a power conditioner for a solar power generation system, a power storage system or the like.

According to the present examples, formation of a thick adhesive fillet can improve insulation characteristics of a semiconductor apparatus and an electric power conversion apparatus.

The invention claimed is:

1. A semiconductor apparatus comprising:
   a base plate;
   an adhesive agent provided on an upper face of the base plate; and
   a casing having a lower face and an inclined face both positioned entirely above an uppermost portion of the upper face of the base plate and an inclined face continuous to the lower face and positioned closer to a center of the base plate than the lower face and positioned directly above the upper face of the base plate, and fixed to the base plate through the adhesive agent adhering to the lower face and the inclined face, wherein
   of the adhesive agent, a portion that is in contact with the inclined face is thicker than all other portions of the adhesive agent that are in contact with the upper face of the base plate.

2. The semiconductor apparatus according to claim 1, comprising:
   a semiconductor device fixed to the upper face, wherein
   the upper face has a first upper face and a second upper face positioned in an upper part above the first upper face, and
   the adhesive agent is applied to the first upper face, and the semiconductor device is provided immediately above the second upper face.

3. The semiconductor apparatus according to claim 1, wherein the adhesive agent is convex in a direction toward the center of the base plate.

4. The semiconductor apparatus according to claim 1, comprising an electrode exposed inside the casing.

5. The semiconductor apparatus according to claim 1, wherein the adhesive agent contains conductive particles.

6. The semiconductor apparatus according to claim 1, wherein the lower face is substantially parallel to an uppermost surface of the upper face of the base plate.

7. A semiconductor apparatus comprising:
   a base plate;
   an adhesive agent provided on an upper face of the base plate; and
   a casing having a lower face and an inclined face both positioned entirely above the upper face of the base plate and an inclined face continuous to the lower face and positioned closer to a center of the base plate than the lower face, and fixed to the base plate through the adhesive agent adhering to the lower face and the inclined face, wherein
   of the adhesive agent, a portion that is in contact with the inclined face is thicker than a portion thereof that is in contact with the lower face, wherein
   the lower face has a first lower face continuous to the inclined face, and a second lower face positioned farther from the center of the base plate than the first lower face,
   the second lower face is positioned in a lower part below the first lower face, and
   a step is positioned between the first lower face and the second lower face.

8. The semiconductor apparatus according to claim 7, wherein the lower face is substantially parallel to the upper face of the base plate.

9. The semiconductor apparatus according to claim 7, wherein the casing is fixed to the base plate through the adhesive agent adhering to the second lower face.

10. An electric power conversion apparatus, comprising:
    a semiconductor apparatus including a base plate, an adhesive agent provided on an upper face of the base plate, and a casing having a lower face and an inclined face both positioned entirely above an uppermost portion of the upper face of the base plate and an inclined face continuous to the lower face and positioned closer to a center of the base plate than the lower face and positioned directly above the upper face of the base plate, and fixed to the base plate through the adhesive agent adhering to the lower face and the inclined face, wherein of the adhesive agent, a portion that is in contact with the inclined face is thicker than all other portions of the adhesive agent that are in contact with the upper face of the base plate,
    a primary converter circuit that includes the semiconductor apparatus and converts input electric power into output electric power; and
    a control circuit that outputs a control signal for controlling the primary converter circuit to the primary converter circuit.

11. The electric power conversion apparatus according to claim 10, comprising:
    a semiconductor device fixed to the upper face, wherein
    the upper face has a first upper face and a second upper face positioned in an upper part above the first upper face, and
    the adhesive agent is applied to the first upper face, and the semiconductor device is provided immediately above the second upper face.

12. The electric power conversion apparatus according to claim 10, wherein the adhesive agent is convex in a direction toward the center of the base plate.

13. The electric power conversion apparatus according to claim 10, comprising an electrode exposed inside the casing.

14. The electric power conversion apparatus according to claim 10, wherein the adhesive agent contains conductive particles.

15. An electric power conversion apparatus, comprising:
    a semiconductor apparatus including a base plate, an adhesive agent provided on an upper face of the base plate, and a casing having a lower face and an inclined face both positioned entirely above the upper face of the base plate and the inclined face continuous to the lower face and positioned closer to a center of the base plate than the lower face, and the casing is fixed to the base plate through the adhesive agent adhering to the lower face and the inclined face, wherein of the adhesive agent, a portion that is in contact with the inclined face is thicker than all other portions thereof that are in contact in contact with the lower face,
    a primary converter circuit that includes the semiconductor apparatus and converts input electric power into output electric power; and
    a control circuit that outputs a control signal for controlling the primary converter circuit to the primary converter circuit, wherein
    the lower face has a first lower face continuous to the inclined face, and a second lower face positioned farther from the center of the base plate than the first lower face,
    the second lower face is positioned in a lower part below the first lower face, and
    a step is positioned between the first lower face and the second lower face.

16. The electric power conversion apparatus according to claim 15, wherein the casing is fixed to the base plate through the adhesive agent adhering to the second lower face.

\* \* \* \* \*